US009640457B2

(12) United States Patent
Tsai et al.

(10) Patent No.: US 9,640,457 B2
(45) Date of Patent: May 2, 2017

(54) POWER AMPLIFIER PACKAGE AND METHOD THEREOF

(71) Applicant: TAIWAN SEMICONDUCTOR MANUFACTURING COMPANY LTD., Hsinchu (TW)

(72) Inventors: Chung-Hao Tsai, Changhua County (TW); Jeng-Shien Hsieh, Kaohsiung (TW); Chuei-Tang Wang, Taichung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 38 days.

(21) Appl. No.: 14/600,555

(22) Filed: Jan. 20, 2015

(65) Prior Publication Data

US 2016/0211214 A1    Jul. 21, 2016

(51) Int. Cl.
| | |
|---|---|
| *H03F 3/195* | (2006.01) |
| *H01L 23/31* | (2006.01) |
| *H01L 23/00* | (2006.01) |
| *H01L 23/367* | (2006.01) |
| *H01L 25/07* | (2006.01) |
| *H01L 23/373* | (2006.01) |

(52) U.S. Cl.
CPC ...... *H01L 23/3121* (2013.01); *H01L 23/3677* (2013.01); *H01L 24/19* (2013.01); *H01L 24/20* (2013.01); *H01L 25/072* (2013.01); *H01L 23/3736* (2013.01); *H01L 23/3738* (2013.01); *H01L 2224/04105* (2013.01); *H01L 2224/12105* (2013.01); *H01L 2224/18* (2013.01); *H01L 2224/24137* (2013.01); *H01L 2224/32225* (2013.01); *H01L 2224/73267* (2013.01); *H01L 2924/0002* (2013.01); *H01L 2924/18162* (2013.01)

(58) Field of Classification Search
CPC .................................. H03F 3/195; H03F 3/187
USPC ...................................... 330/307, 124 R, 295
See application file for complete search history.

(56) References Cited

U.S. PATENT DOCUMENTS

| | | | | |
|---|---|---|---|---|
| 5,164,683 | A * | 11/1992 | Shields | ................. H01L 23/642 330/302 |
| 6,424,227 | B1 * | 7/2002 | El-Sharawy | ........ H01L 23/5227 330/165 |
| 7,123,786 | B2 * | 10/2006 | Welch | .................... B82Y 20/00 385/14 |
| 8,892,063 | B2 * | 11/2014 | Jones | ......................... 455/127.4 |

(Continued)

*Primary Examiner* — Henry Choe
(74) *Attorney, Agent, or Firm* — WPAT, P.C., INTELLECTUAL PROPERTY ATTORNEYS; Anthony King

(57) ABSTRACT

A device is provided, which includes a wiring structure including a first surface and a second surface opposite the first surface. The device also includes a first semiconductor die on the first surface of the wiring structure where the first semiconductor die includes first power amplifier unit. The device further includes a second semiconductor die on the first surface of the wiring structure where the second semiconductor has a second power amplifier unit and is spaced apart from the first semiconductor die. In addition, the device includes a first input port at the second surface of the wiring structure, and a first conductor in the wiring structure to electrically connect the first input port to the first semiconductor die and the second semiconductor die.

18 Claims, 9 Drawing Sheets

(56) References Cited

U.S. PATENT DOCUMENTS

2015/0145601 A1* 5/2015 Moronval .............. H03F 3/211
  330/295
2015/0171797 A1* 6/2015 Ni ............................ H03F 1/32
  330/296

* cited by examiner

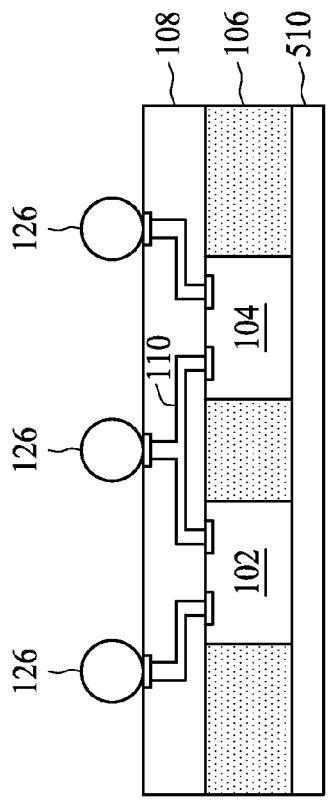
FIG. 5A
FIG. 5B
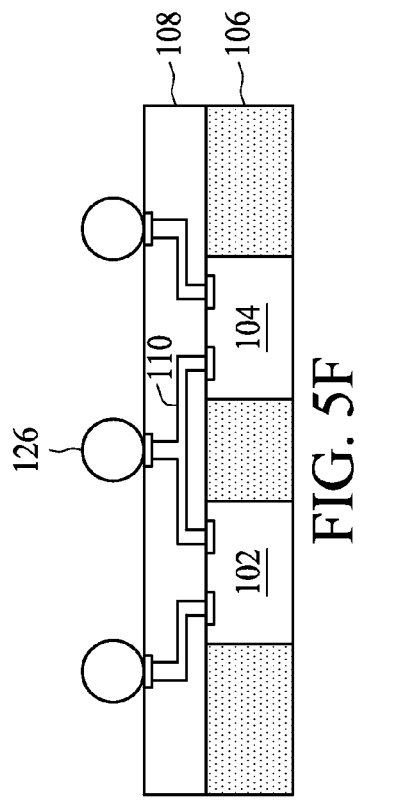
FIG. 5C
FIG. 5D
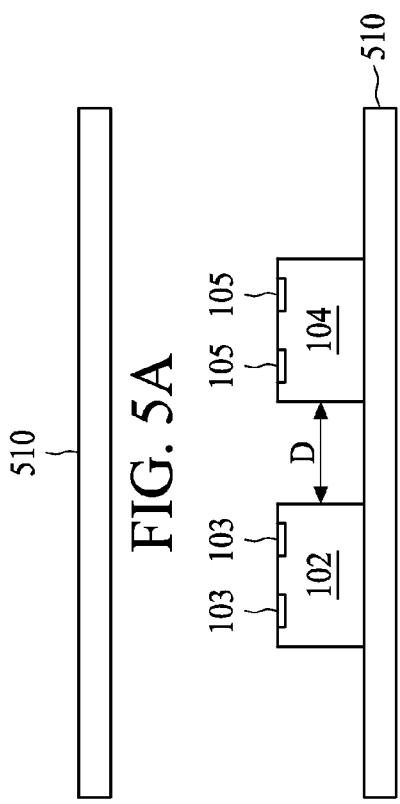
FIG. 5E
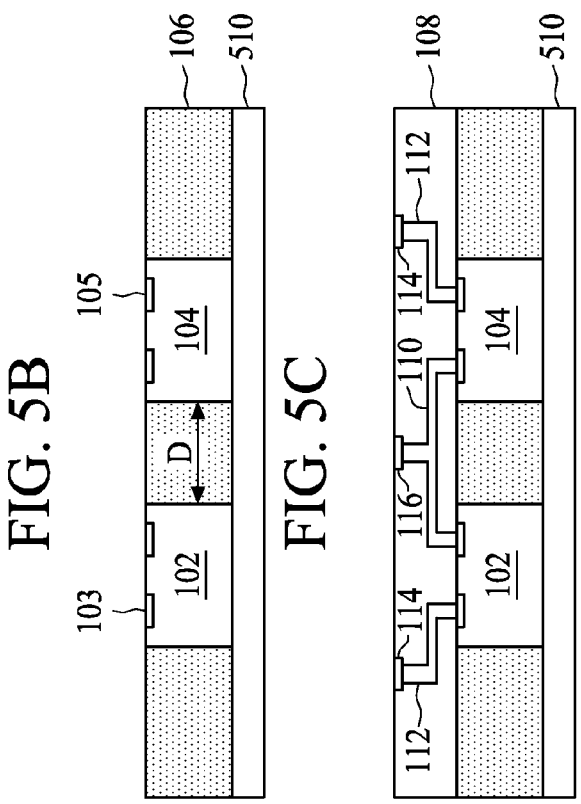
FIG. 5F

POWER AMPLIFIER PACKAGE AND METHOD THEREOF

BACKGROUND

In wireless communication, radio frequency power amplifiers are used to convert a signal of relatively low power to a signal of relatively high power. With the development and evolution in semiconductor fabrication, radio frequency power amplifiers are required to meet modern design requirements, such as smaller size, higher operating band, larger power gain and wider bandwidth. Moreover, in order to enhance system efficiency and reduce production cost, it is required to integrate power amplifiers with other components, such as wireless transceivers, in the chip design.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5F are schematic diagrams showing a manufacturing process of a PA package, in accordance with some embodiments.

DETAILED DESCRIPTION

Figure 1A:
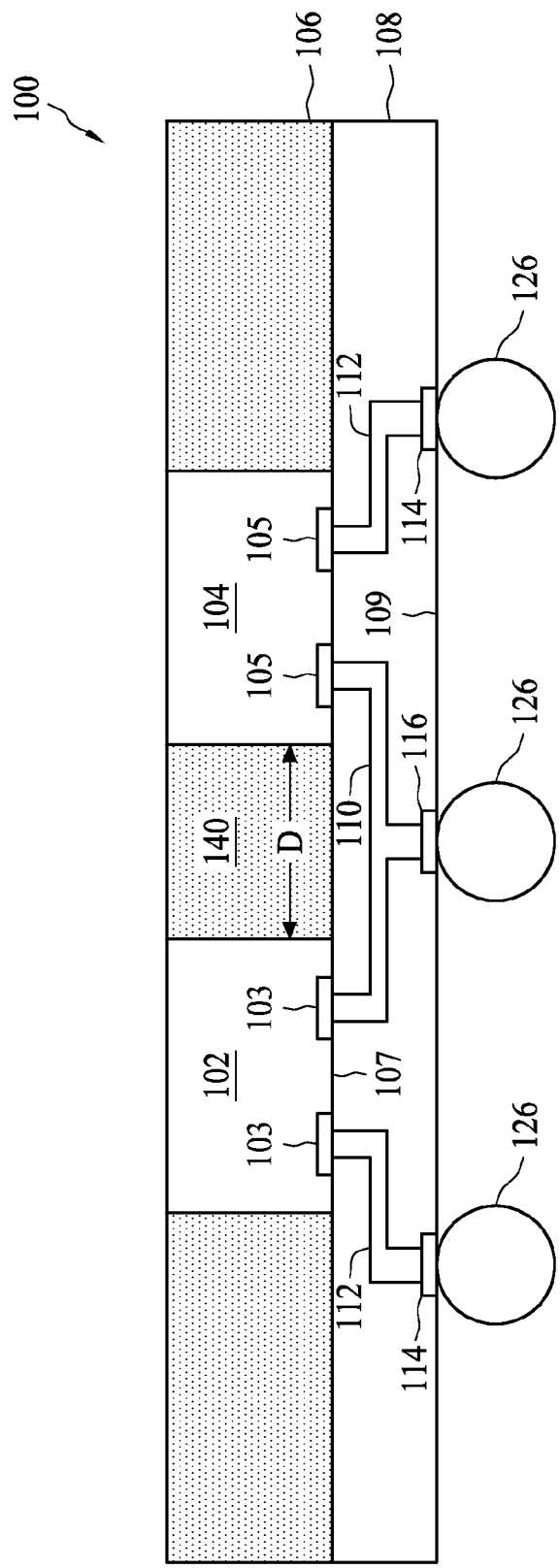
FIG. 1A is a schematic side view of a power amplifier (PA) package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a schematic side view of a power amplifier (PA) package 100 in accordance with some embodiments. Referring to FIG. 1A, PA package 100 includes a first PA unit 102, a second PA unit 104, an encapsulating layer 106 and a wiring structure 108.

First PA unit 102 is disposed on a first surface 107 of wiring structure 108. Moreover, first PA unit 102 includes active devices (not shown) for providing power amplification and contact pads 103 for signal transmission.

Likewise, second PA unit 104 is disposed on the first surface 107 of wiring structure 108. Moreover, second PA unit 104 includes active devices (not shown) for providing power amplification and contact pads 105 for signal transmission.

First PA unit 102 and second PA unit 104 are separated from each other by a distance D to facilitate heat dissipation. In some existing approaches, PA units are formed simultaneously in an array in a semiconductor manufacturing process. Since such PA units are arranged in a compact manner, heat generated by the PA units cannot be easily dissipated and may accumulate in the package. Consequently, the performance of power amplification deteriorates significantly. In PA package 100, separation of first PA unit 102 and second PA unit 104 by distance D defines a region 140 therebetween on the wiring structure 108, and leads to an enlarged area for heat dissipation. As a result, heat that would otherwise accumulate at the interface between neighboring PA units in the existing approaches can be more easily dissipated.

Encapsulating layer 106 encapsulates first PA unit 102 and second PA unit 104 on first surface 107 of wiring structure 108. In an embodiment, encapsulating layer 106 includes a molding compound or other suitable materials.

Wiring structure 108, which may include conductive layers and intermediate insulating layers, is configured to electrically connect first PA unit 102 and second PA unit 104 to electrical connectors 126. Wiring structure 108 includes a first signal conductor 110 and a first signal contact pad 116 for signal transmission. In an embodiment, first signal contact pad 116 serves as an input port of package 100. Consequently, first PA unit 102 receives a signal via, in order, electrical connector 126, first signal contact pad 116, first signal conductor 110 and contact pad 103. Furthermore, second PA unit 104 receives a signal via, in order, electrical connector 126, first signal contact pad 116, first signal conductor 110 and contact pad 105.

Moreover, wiring structure 108 includes grounding conductors 112 and grounding contact pads 114 for grounding purpose. Grounding conductors 112 connect associated electrical connectors 126 to first PA unit 102 and second PA unit 104. In addition, first signal contact pad 116 or grounding contact pads 114 are configured for holding electrical connectors 126. In an embodiment, under bump metallurgy (UBM) pads are disposed between electrical connectors 126 and first signal contact pad 116 or grounding contact pads 114. In another embodiment, electrical connectors 126 include one of ball grid array (BGA), wirebonds, and bumps.

Figure 1B:
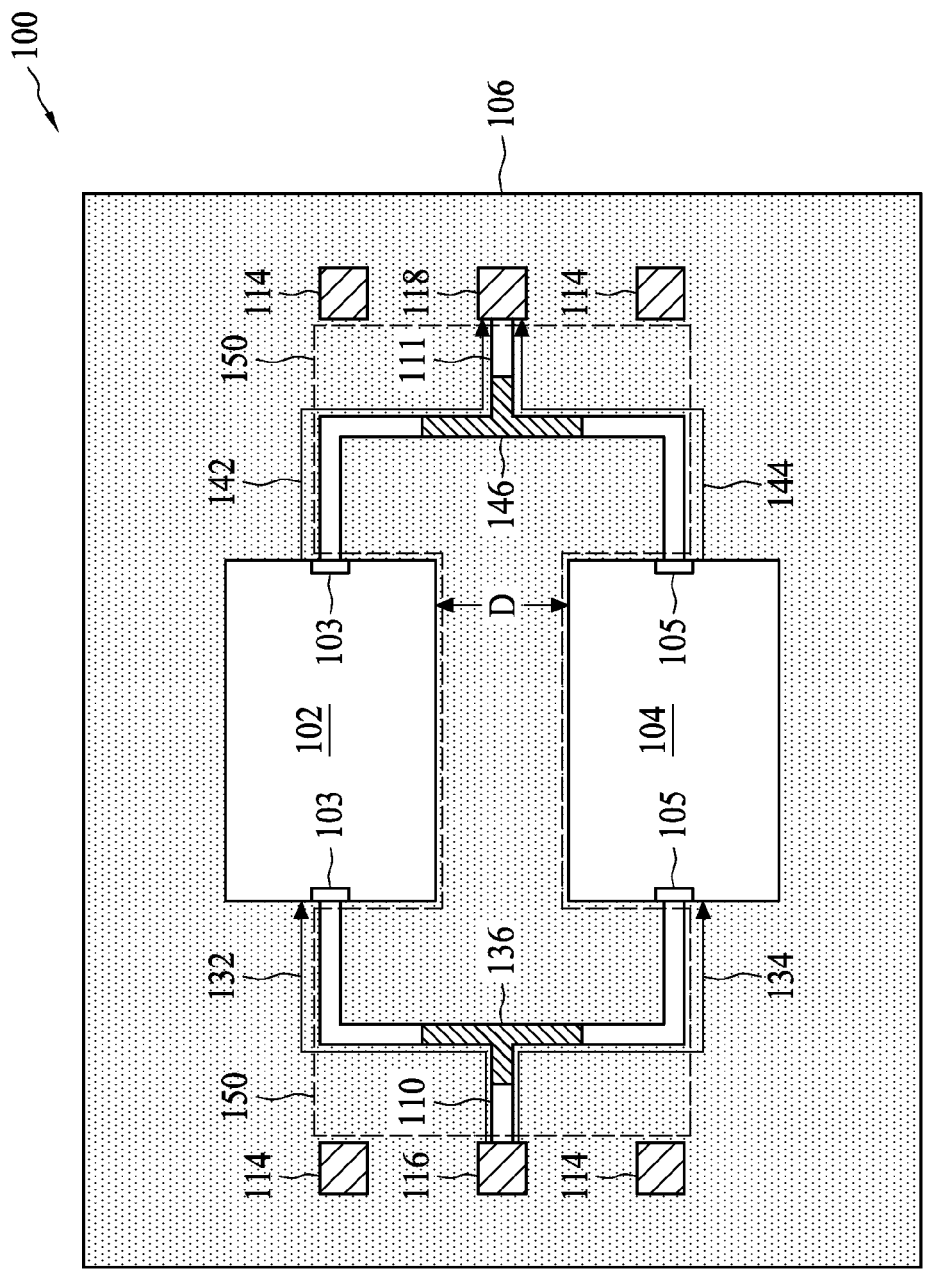
FIG. 1B is a schematic bottom view of the PA package illustrated in FIG. 1A in accordance with some embodiments.

FIG. 1B is a schematic bottom view of the PA package 100 illustrated in FIG. 1A in accordance with some embodiments. Referring to FIG. 1B, package 100 includes a second signal conductor 111 and a second signal contact pad 118 in the wiring structure 108 for signal transmission. In an embodiment, second signal contact pad 118 serves as an output port of package 100. Consequently, first PA unit 102 transmits a signal via contact pad 103 and second signal conductor 111 to second signal contact pad 118. Furthermore, second PA unit 104 transmits a signal via contact pad 105 and second signal conductor 111 to second signal contact pad 118.

As previously discussed, first signal contact pad 116 serves an input port of package 100 in some embodiments. In that case, first signal conductor 110 is configured to distribute power to first PA unit 102 and second PA unit 104. Specifically, first signal conductor 110 provides a first transmission path 132 for delivering signal power from first signal contact pad 116 to first PA unit 102. Also, first signal conductor 110 provides a second transmission path 134 for delivering signal power from first signal contact pad 116 to second PA unit 104. In an embodiment, as signals are transmitted via first signal contact pad 116 to first PA unit 102 and second PA unit 104, power levels received at first PA unit 102 and second PA unit 104 are substantially equal. Accordingly, power loss in first transmission path 132 is substantially equal to that in second transmission path 134. In another embodiment, first transmission path 132 is equal to second transmission path 134 in length.

In PA package 100, a first power splitter 136 is disposed upstream first transmission path 132 and second transmission path 134. In the present embodiment, first power splitter 136 is disposed at the joint of first transmission path 132 and second transmission path 134. Moreover, first power splitter 136 is configured to support power delivering and provide phase adjustment for currents flowing in first transmission path 132 and second transmission path 134. In an embodiment, first power splitter 136 includes one of a balun, coupler and transformer.

In an embodiment, first signal conductor 110 and second signal conductor 111 are formed by an electrical conductive material, such as copper (Cu), silver (Ag), aluminum (Al), and gold (Au). While the line width of a conductor has been increasingly shrinking in order to pursue size miniaturization, the line depth of a conductor is made as large as the fabrication process permits to lower effective resistance. In an embodiment, the line depth of the first signal conductor 110 and the second signal conductor 111 ranges from approximately 2 micrometers (m) to approximately 15 μm.

Second signal conductor 111 connects first PA unit 102 and second PA unit 104 to second signal contact pad 118. As previously discussed, second signal contact pad 118 serves as an output port of package 100 in some embodiments. In that case, second signal conductor 111 is configured to combine currents from outputs of first PA unit 102 and second PA unit 104. Second signal conductor 111 provides a third transmission path 142 for delivering signal power from first PA unit 102 to second signal contact pad 118. Moreover, second signal conductor 111 provides a fourth transmission path 144 for delivering signal power from second PA unit 104 to second signal contact pad 118. In an embodiment, as signals are transmitted from first PA unit 102 and second PA unit 104 to second signal contact pad 118, power levels received at second signal contact pad 118 are equal. Accordingly, power loss in third transmission path 142 is equal to that in fourth transmission path 144. In another embodiment, third transmission path 142 is equal to fourth transmission path 144 in length.

In some embodiments, a first power combiner 146 is disposed downstream third transmission path 142 and fourth transmission path 144. In the present embodiment, first power combiner 146 is disposed at the joint of third transmission path 142 and fourth transmission path 144. Moreover, first power combiner 146 is configured to support power delivering and provide phase adjustment for currents from transmission paths 142 and 144. In an embodiment, first power combiner 146 includes one of a balun, coupler and transformer.

In some existing approaches, power amplifiers manufactured by system on a chip (SoC) techniques integrate multiple PA units within a single chip in order to increase power delivery capacity while minimizing product size and manufacturing cost. The PA units and their associated interconnections or wires are disposed on a same substrate. It is well known that silicon is an electrically lossy material and a silicon-based substrate may thus be liable to power loss. In particular, a current flow in a conductor embedded in an electrical insulator may introduce an unwanted current (which is called a return current) within the silicon substrate. The return current in the silicon-based substrate generates heat in the system and thus leads to power loss.

In the present disclosure, wiring structure 108 is formed in a process independent of first PA unit 102 and second PA unit 104. A region 150 for power transmission, defined by substantially the transmission paths 132, 134, 142 and 144 in wiring structure 108 under first PA unit 102 and second PA unit 104, is separated from silicon-based substrates (not shown) of first PA unit 102 and second PA unit 104. As a result, power loss that would otherwise occur in the existing SoC approaches due to return current can be significantly alleviated. Moreover, the efficacy of power splitting or power combining for multiple PA units is enhanced.

Figure 2:
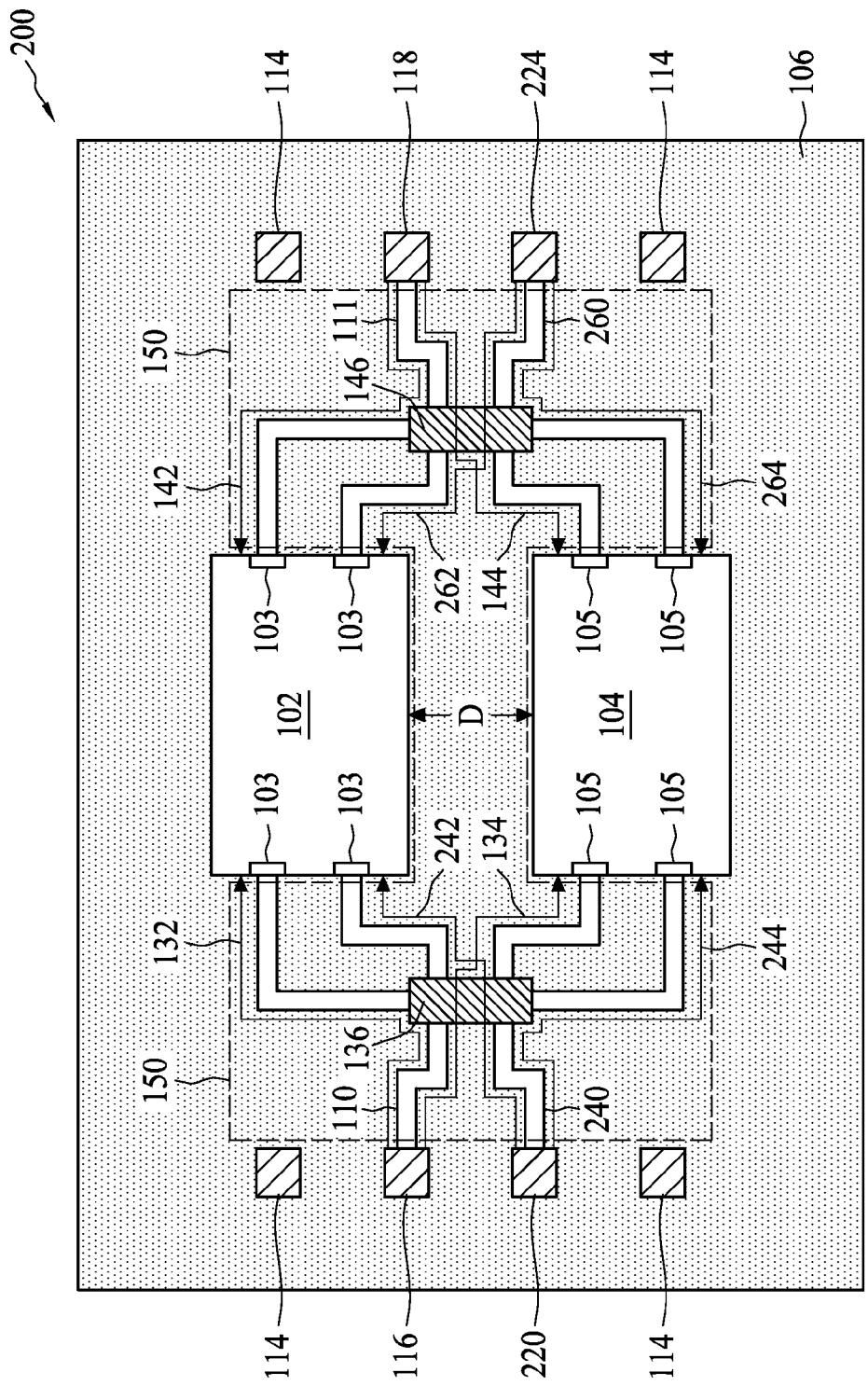
FIG. 2 is a schematic bottom view of another PA package in accordance with some embodiments.

FIG. 2 is a schematic bottom view of a PA package 200 in accordance with some embodiments. Referring to FIG. 2, PA package 200 is similar to PA package 100 described and illustrated with reference to FIG. 1B except that, for example, PA package 200 further includes a third signal conductor 240 and a fourth signal conductor 260 in wiring structure 108.

In an embodiment, a third signal contact pad 220 serves as an input port of PA package 200. Consequently, first PA unit 102 receives a signal via third signal contact pad 220, third signal conductor 240 and contact pad 103. Furthermore, second PA unit 104 receives a signal via third signal contact pad 220, third signal conductor 240 and contact pad 105.

First signal conductor 110 and third signal conductor 240 are configured to form a differential input pair and distribute power to first PA unit 102 and second PA unit 104. Specifically, third signal conductor 240 provides a fifth transmission path 242 for delivering signal power from third signal contact pad 220 to first PA unit 102. Also, third signal conductor 240 provides a sixth transmission path 244 for delivering signal power from third signal contact pad 220 to second PA unit 104. In an embodiment, as signals are transmitted via third signal contact pad 220 to first PA unit 102 and second PA unit 104, power levels received at first PA unit 102 and second PA unit 104 are substantially equal. Accordingly, power loss in fifth transmission path 242 is substantially equal to that in sixth transmission path 244. In another embodiment, fifth transmission path 242 is equal to sixth transmission path 244 in length. Moreover, fifth transmission path 242 and sixth transmission path 244 are equal to first transmission path 132 in length.

Moreover, a fourth signal contact pad 224 serves as an output port of PA package 200. Consequently, first PA unit 102 transmits a signal via contact pad 103 and fourth signal conductor 260 to fourth signal contact pad 224. Furthermore, second PA unit 104 transmits a signal via contact pad 105 and fourth signal conductor 260 to fourth signal contact pad 224.

Second signal conductor 111 and fourth signal conductor 260 are configured to form a differential output pair and combine power from outputs of first PA unit 102 and second PA unit 104. Fourth signal conductor 260 provides a seventh transmission path 262 for delivering signal power from first PA unit 102 to fourth signal contact pad 224. Moreover, fourth signal conductor 260 provides an eighth transmission path 264 for delivering signal power from second PA unit 104 to fourth signal contact pad 224. In an embodiment, as signals are transmitted from first PA unit 102 and second PA unit 104 to fourth signal contact pad 224, power levels received at fourth signal contact pad 224 are equal. Accordingly, power loss in seventh transmission path 262 is equal to that in eighth transmission path 264. In another embodiment, seventh transmission path 262 is equal to eighth transmission path 264 in length. Moreover, seventh transmission path 262 and eighth transmission path 264 are equal to second transmission path 134 in length.

In PA package 200, first power splitter 136 is coupled to both first signal conductor 110 and third signal conductor 240. Thus, first power splitter 136 is disposed upstream fifth transmission path 242 and sixth transmission path 244. In the present embodiment, first power splitter 136 is disposed at the joint of fifth transmission path 242 and sixth transmission path 244. As previously discussed, first power splitter 136 is configured to support power delivering and provide phase adjustment for currents flowing in fifth transmission path 242 and sixth transmission path 244.

In an embodiment, third signal conductor 240 and fourth signal conductor 260 are formed by an electrical conductive material, such as copper (Cu), silver (Ag), aluminum (Al), and gold (Au). In some embodiments, the line depth of the third signal conductor 240 and the fourth signal conductor 260 ranges from approximately 2 µm to approximately 15 µm.

In some embodiments, first power combiner 146 is coupled to fourth signal conductor 260. Thus, first power combiner 146 is disposed downstream seventh transmission path 262 and eighth transmission path 264. In the present embodiment, first power combiner 146 is disposed at the joint of seventh transmission path 262 and eighth transmission path 264. As previously discussed, first power combiner 146 is configured to support power delivering and provide phase adjustment for currents from transmission paths 262 and 264.

Figure 3A:
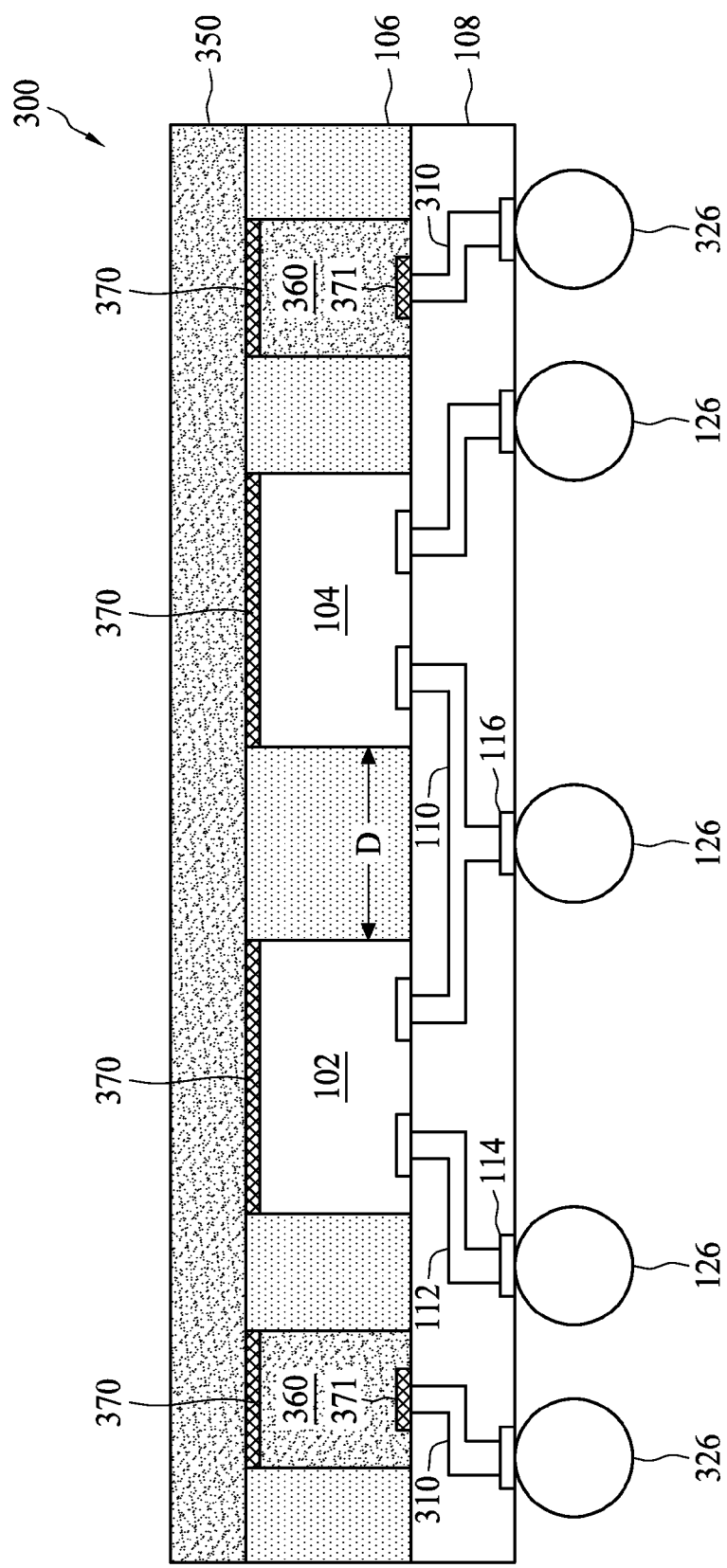
FIG. 3A is a schematic side view of still another PA package in accordance with some embodiments.

FIG. 3A is a schematic side view of a PA package 300 in accordance with some embodiments. Referring to FIG. 3A, PA package 300 is similar to PA package 100 described and illustrated with reference to FIG. 1A except that, for example, PA package 300 includes a thermal conductive layer 350 and a first thermal interface layer 370.

First thermal interface layer 370 is disposed on first PA unit 102 and second PA unit 104. Thermal conductive layer 350 is disposed on encapsulating layer 106 and first thermal interface layer 370. First thermal interface layer 370 and thermal conductive layer 350 establish a heat dissipation path to dissipate heat from first PA unit 102 and second PA unit 104, in addition to the heat dissipation path through wiring structure 108 to electrical connectors 126. In an embodiment, thermal conductive layer 350 includes silicon-based material. Moreover, first thermal interface layer 370 includes thermal interface material (TIM), such as thermal grease, phase change material (PCM), or thermally conductive elastomer.

In some embodiments, as illustrated, PA package 300 further includes thermal conductive columns 360 between wiring structure 108 and thermal conductive layer 350. Further, first thermal interface layer 370 is also provided between thermal conductive columns 360 and thermal conductive layer 350, and a second thermal interface layer 371 is provided between thermal conductive columns 360 and wiring structure 108. Conductive columns 360 are configured to dissipate heat from first PA unit 102 and second PA unit 104 through the thermal conductive layer 350, or through additional conductors 310 in wiring structure 108 towards additional electrical connectors 326. Heat management can be further improved since additional heat transmission paths are established for PA package 300. In an embodiment, thermal conductive columns 360 include silicon-based material, or metal such as copper. Moreover, second thermal interface layer 371 includes thermal interface material (TIM), such as thermal grease, phase change material (PCM), or thermally conductive elastomer.

Figure 3B:
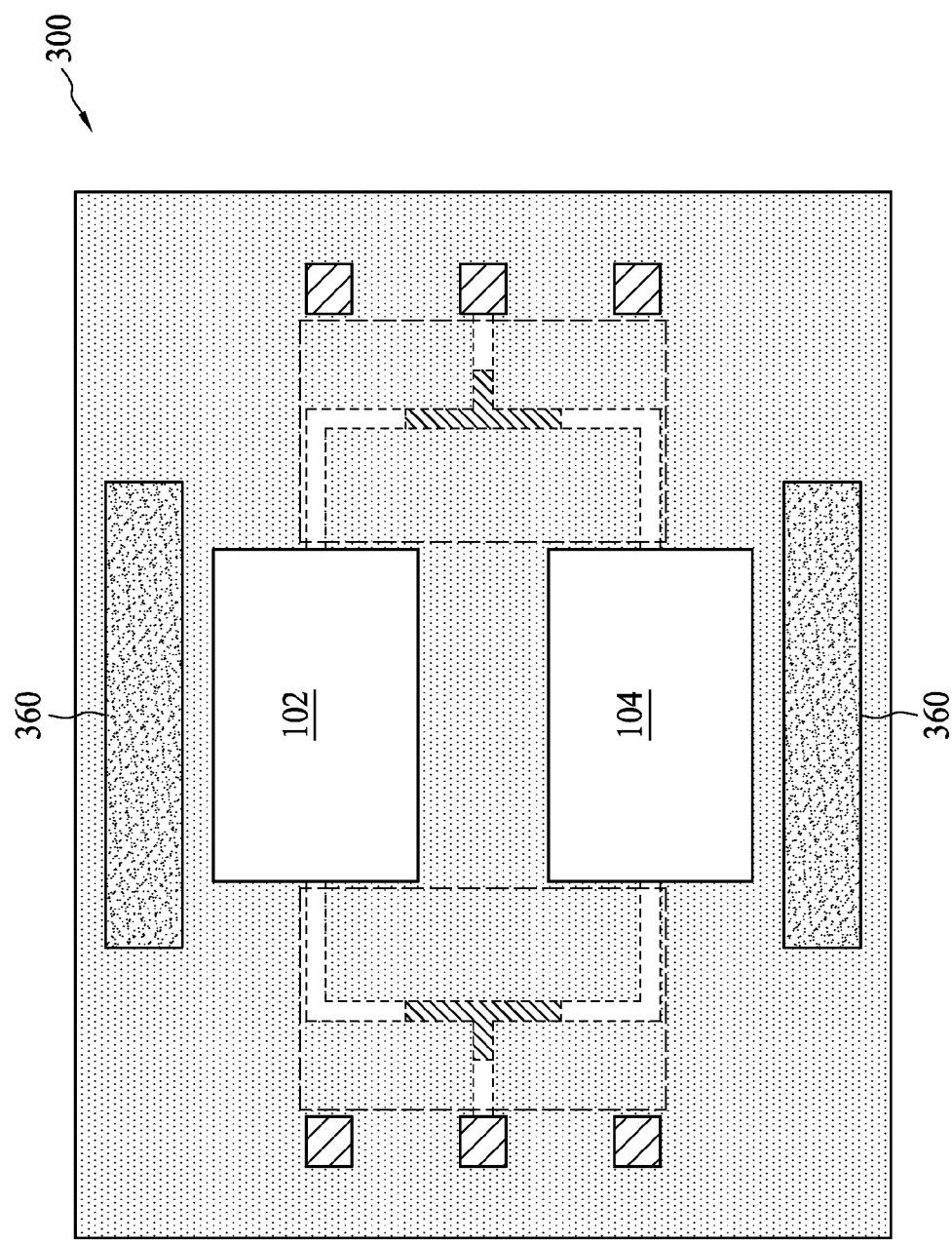
FIGS. 3B and 3C are schematic bottom views of the PA package illustrated in FIG. 3A in accordance with some embodiments.
Figure 3C:
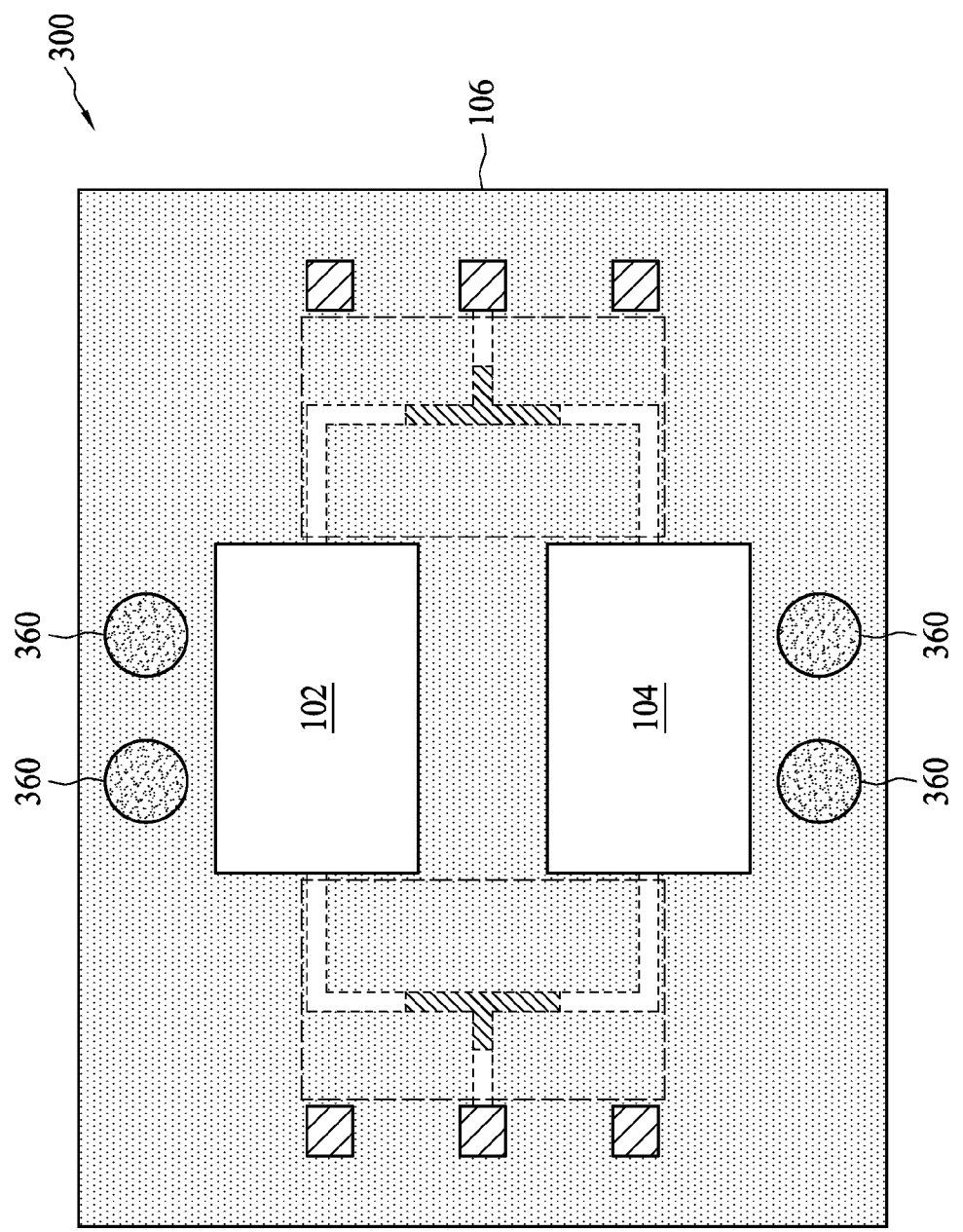

FIGS. 3B and 3C are schematic bottom views of PA package 300 illustrated in FIG. 3A, in accordance with some embodiments. Referring to FIG. 3B, thermal conductive columns 360 take the form of a box or cuboid, and extend along first PA unit 102 and second PA unit 104 in a peripheral region of PA package 300. Referring to FIG. 3C, thermal conductive columns 360 take the form of a cylinder, and are disposed along first PA unit 102 and second PA unit 104 in a peripheral region of PA package 300. The shape, size and position of thermal conductive columns 360 can be designed to enhance heat dissipation efficiency without compromising the performance of PA package 300.

Figure 4A:
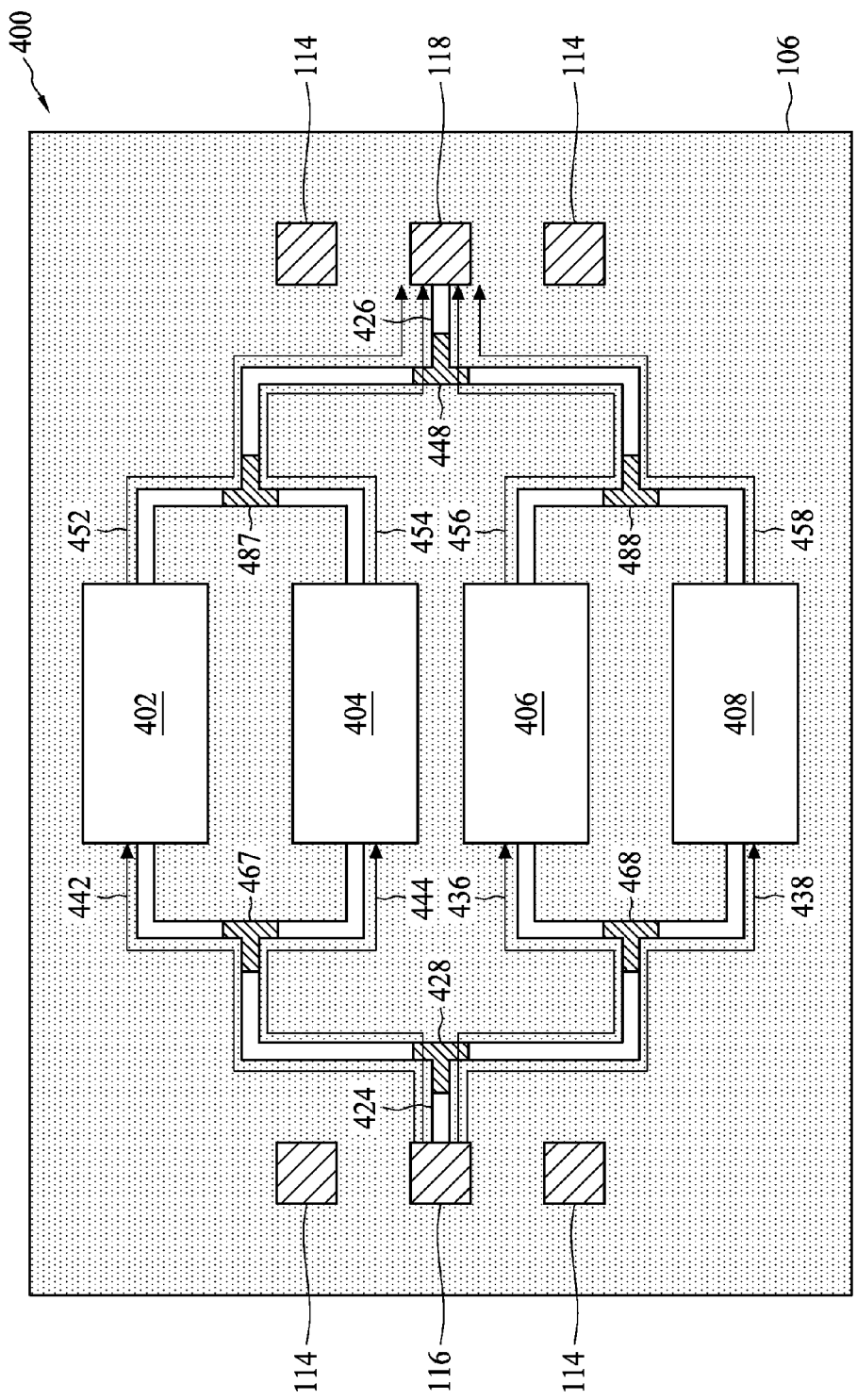
FIGS. 4A and 4B are schematic diagrams of yet still another PA package in accordance with some embodiments.
Figure 4B:
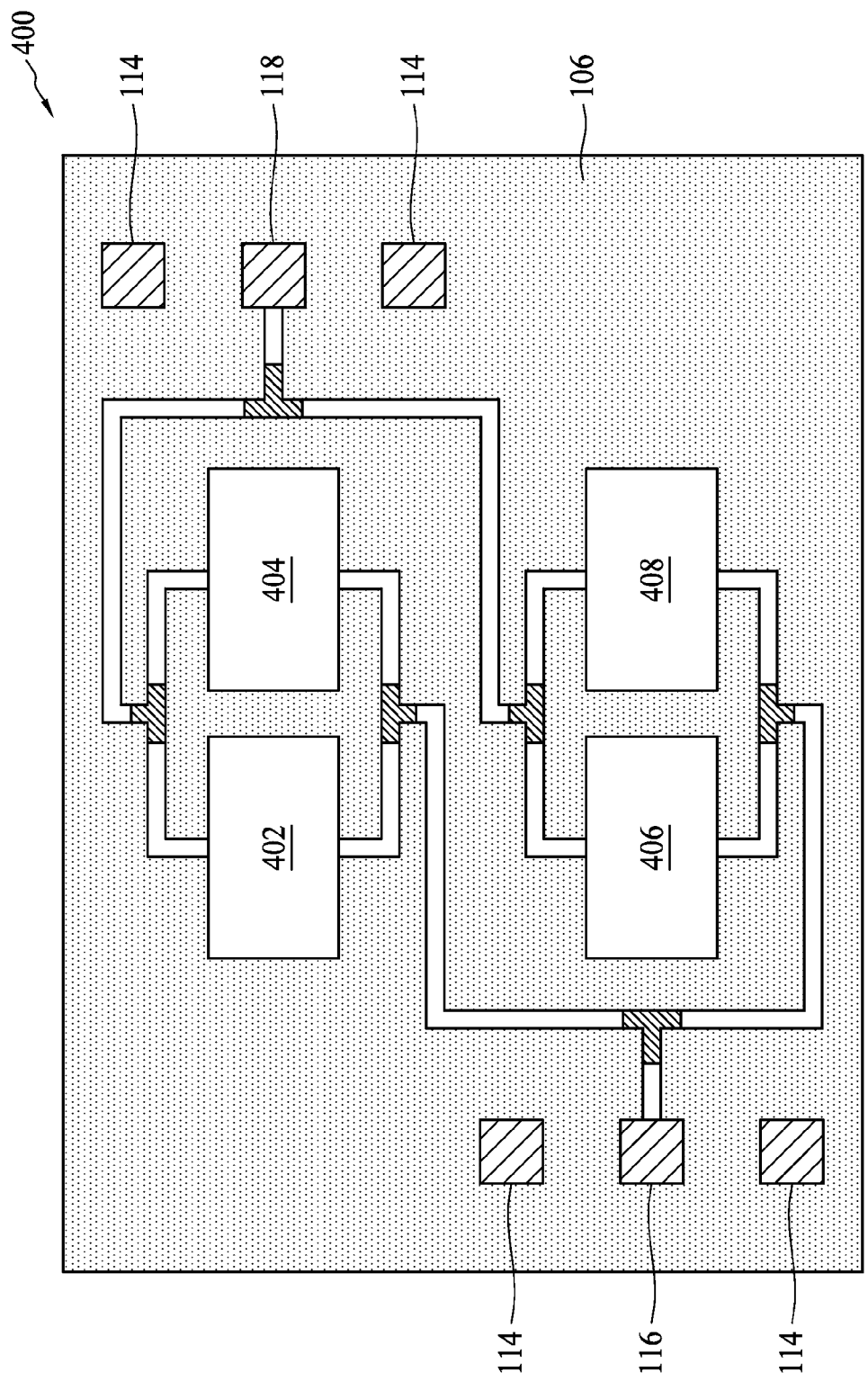

FIGS. 4A and 4B are schematic diagrams of a PA package 400 in accordance with some embodiments. Referring to FIG. 4A, PA package 400 is similar to PA package 100 described and illustrated with reference to FIG. 1B except that, for example, PA package 400 includes a first PA unit 402, a second PA unit 404, a third PA unit 406, and a fourth PA unit 408. First PA unit 402, second PA unit 404, third PA unit 406 and fourth PA unit 408 are similar in function to first PA unit 102 or second PA unit 104 in FIG. 1B, and are separated from each other to facilitate heat dissipation and power loss reduction.

In some embodiments, first signal contact pad 116 serves as an input port of PA package 400. A first signal conductor 424 in a wiring structure (not shown) connects first signal contact pad 116 via a first transmission path 442 to first PA unit 402, via a second transmission path 444 to second PA unit 404, via a third transmission path 436 to third PA unit 406, and via a fourth transmission path 438 to fourth PA unit 408. First signal conductor 424 serves as a power splitter to dispense power to first PA unit 402, second PA unit 404, third PA unit 406 and fourth PA unit 408.

In an embodiment, as signals are transmitted via first signal contact pad 116 to first PA unit 102 and second PA unit 104, power levels received at first PA unit 102 and second PA unit 104 are substantially equal. Accordingly, power loss in first transmission path 442 is substantially equal to that in second transmission path 444. In another embodiment, first transmission path 442 is equal to second transmission path 444 in length. Moreover, power loss in third transmission path 436 is substantially equal to that in fourth transmission path 438. In another embodiment, third transmission path 436 is equal to fourth transmission path 438 in length.

In PA package 400, a first power splitter 428 is disposed upstream first transmission path 442, second transmission path 444, third transmission path 436 and fourth transmission path 438. Moreover, a second power splitter 467 is disposed at the joint of first transmission path 442 and second transmission path 444, and another second power splitter 468 is disposed at the joint of third transmission path 436 and fourth transmission path 438. First power splitter 428 and second power splitter 467, 468 are similar in function to first power splitter 136 or first power combiner 146 in FIG. 1B.

Moreover, in some embodiments, second signal contact pad 118 serves as an output port of PA package 400. A second signal conductor 426 in the wiring structure connects first PA unit 402 to second signal contact pad 118 via a fifth transmission path 452, connects second PA unit 404 to second signal contact pad 118 via a sixth transmission path 454, connects third PA unit 406 to second signal contact pad 118 via a seventh transmission path 456, and connects fourth PA unit 408 to second signal contact pad 118 via an eighth transmission path 458. Second signal conductor 426 is configured to combine currents from first PA unit 402, second PA unit 404, third PA unit 406 and fourth PA unit 408.

In an embodiment, as signals are transmitted from first PA unit 102 and second PA unit 104 to second signal contact pad 118, power levels received at second signal contact pad 118 are equal. Accordingly, power loss in fifth transmission path 452 is equal to that in sixth transmission path 454. In another embodiment, fifth transmission path 452 is equal to sixth transmission path 454 in length. Moreover, power loss in seventh transmission path 456 is equal to that in eighth transmission path 458. In another embodiment, seventh transmission path 456 is equal to eighth transmission path 458 in length.

In PA package 400, a first power combiner 448 is disposed downstream fifth transmission path 452, sixth transmission path 454, seventh transmission path 456 and eighth transmission path 458. Moreover, a second power combiner 487 is disposed at the joint of fifth transmission path 452 and sixth transmission path 454, and another second power combiner 488 is disposed at the joint of seventh transmission path 456 and eighth transmission path 458. First power combiner 448 and second power combiners 487, 488 are similar in function to first power splitter 136 or first power combiner 146 in FIG. 1B.

In an embodiment, first signal conductor 424 and second signal conductor 426 are formed by an electrical conductive material, such as copper (Cu), silver (Ag), aluminum (Al), and gold (Au). Moreover, the line depth of the first signal conductor 424 and second signal conductor 426 ranges from approximately 2 μm to approximately 15 μm.

In FIG. 4A, first PA unit 402, second PA unit 404, third PA unit 406 and fourth PA unit 408 are arranged in a column. Referring to FIG. 4B, first PA unit 402, second PA unit 404, third PA unit 406, and fourth PA unit 408 are arranged in an array. However, the topology of PA units in a PA package according to the present disclosure is not limited to a specific arrangement. For example, in other embodiments, first PA unit 402, second PA unit 404, third PA unit 406 and fourth PA unit 408 may be arranged in a column. Moreover, in still other embodiments, PA units may be arranged in a larger array.

FIGS. 5A-5F are schematic diagrams showing a manufacturing process of a PA package, in accordance with some embodiments. Referring to FIG. 5A, a carrier 510 is provided, on which semiconductor components and device features are to be formed. Carrier 510 in an embodiment is thermally conductive, and includes a silicon-based material such as silicon or silicon oxide, or other suitable materials such as aluminum oxide, or a combination of the above-mentioned materials. Carrier 510 is substantially planar to facilitate attachment of semiconductor devices.

Referring to FIG. 5B, dies of first PA unit 102 and second PA unit 104 are attached on carrier 510 by means of an adhesive layer (not shown), and are separated from each other by distance D. As previously discussed, first PA unit 102 and second PA unit 104 are fabricated in a manufacturing process and sawed into individual dies or chips. As a result, each of first PA unit 102 and second PA unit 104 includes active devices, metallization layers, and contact pads formed in a substrate.

In the embodiments that carrier 510 includes a silicon-based material, carrier 510 can subsequently serve as a thermal conductive layer, such as the thermal conductive layer 350 described and illustrated with reference to FIG. 3A. In that case, in some embodiments, before first PA unit 102 and second PA unit 104 are attached, a first patterned layer (not shown) for heat dissipation is formed on carrier 510. The first patterned layer subsequently serves as the first thermal interface layer 370 as illustrated in FIG. 3A. Moreover, in other embodiments, a patterned layer of, for example, a silicon-based material or metal, is formed on carrier 510. The patterned layer subsequently serves as the thermal conductive columns 360 as illustrated in FIG. 3A.

Referring to FIG. 5C, first PA unit 102 and second PA unit 104 are encapsulated with an encapsulating material, which subsequently forms the encapsulating layer 106. Contact pads 103 and 105 of first PA unit 102 and second PA unit 104, respectively, are exposed. In an embodiment, the encapsulating material includes polyimide, polyphenylene sulfide (PPS), polyetheretherketone (PEEK), polyethersulfone (PES), a heat resistant crystal resin, or a combination thereof.

In the embodiments that thermal conductive columns 360 are provided, a second patterned layer (not shown) for heat dissipation is formed on encapsulating layer 106. The second patterned layer subsequently serves as the second thermal interface layer 371 as illustrated in FIG. 3A.

Referring to FIG. 5D, wiring structure 108 is formed on encapsulating layer 106, first PA unit 102 and second PA unit 104. Wiring structure 108 may include several alternating sub-layers of dielectric and conductive materials and may be formed through any suitable processes, such as deposition and damascene. In some embodiments in forming wiring structure 108, initially a seed layer of a titanium copper alloy is provided by, for example, a suitable process such as chemical vapor deposition (CVD) or sputtering. A patterned photoresist layer may then be formed on the seed layer, exposing portions of the seed layer.

Next, a patterned conductive layer is formed on the seed layer by a plating process. The patterned conductive layer in an embodiment has a thickness between approximately 2 μm and 15 μm, for example, approximately 5 μm. The patterned conductive layer may include a material selected from aluminum (Al), copper (Cu) and gold (Au), and may be formed by another suitable process such as CVD or physical vapor deposition (PVD) followed by a patterning process.

Subsequently, the patterned photoresist layer is stripped. A dielectric layer is then formed on the patterned conductive layer for protection by, for example, a CVD process. In an embodiment the dielectric layer includes silicon oxide. The processes of forming dielectric and conductive layers may be repeated in order to form the wiring structure 108 having signal conductors 110, 112 and contact pads 114, 116, 118. Next, wiring structure 108 is etched to expose contact pads 114, 116 and 118.

Referring to FIG. 5E, electrical connectors 126 are formed on contact pads 114 and 116. In an embodiment, electrical connectors 126 include solder bumps, ball grid array bumps, microbumps, or controlled collapse chip connection (C4) bumps. Moreover, electrical connectors 126 include a material such as tin, silver or copper.

Referring to FIG. 5F, carrier substrate 510 is removed, resulting in PA package 100 illustrated in FIG. 1A. In the embodiments where carrier substrate 510 serves as the thermal conductive layer 350, however, carrier substrate 510 is reduced in thickness rather than totally removed, resulting in PA package 300 illustrated in FIG. 3A.

In some embodiments, a device is provided, which includes a wiring structure having a first surface and a second surface opposite the first surface. The device also includes a first semiconductor die having a first power amplifier unit on the first surface of the wiring structure, and a second semiconductor die having a second power amplifier unit on the first surface of the wiring structure. The second semiconductor is spaced apart from the first semiconductor die. In addition, the device further includes an input port at the second surface of the wiring structure, and a signal conductor in the wiring structure. The signal conductor is configured to electrically connect the input port to the first semiconductor die and the second semiconductor die.

In some embodiments, a device is provided, which includes a wiring structure having a first surface and a second surface opposite the first surface, a first semiconductor die including a first power amplifier unit on the first surface of the wiring structure, and a second semiconductor die including a second power amplifier unit on the first surface of the wiring structure. The device also includes a thermal conductive layer on the first semiconductor die and the second semiconductor die.

In some embodiments, a method is provided, which includes an operation of providing a carrier. The method also includes an operation of attaching a first semiconductor die and a second semiconductor die on the carrier, wherein the first semiconductor die includes a first power amplifier unit, and the second semiconductor die includes a second power amplifier unit. Further, the second semiconductor die is spaced apart from the first semiconductor die. In addition, the method includes an operation of encapsulating the first semiconductor die and the second semiconductor die in an encapsulating layer, and an operation of forming a wiring structure on the encapsulating layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a wiring structure including a first surface and a second surface opposite the first surface;
   a first semiconductor die on the first surface of the wiring structure, the first semiconductor die including a first power amplifier unit;
   a second semiconductor die on the first surface of the wiring structure, the second semiconductor including a second power amplifier unit and being spaced apart from the first semiconductor die;
   a first input port at the second surface of the wiring structure;
   a first conductor, in the wiring structure, configured to electrically connect the first input port to the first semiconductor die and the second semiconductor die; and
   a first output port at the second surface of the wiring structure; and
   a second conductor, in the wiring structure, configured to connect the first semiconductor die and the second semiconductor die to the first output port,
   wherein the second conductor provides a first transmission path for delivering power from the first semiconductor die to the first output port, and a second transmission path for delivering power from the second semiconductor die to the first output port.

2. The device according to claim 1, wherein the first conductor provides a third transmission path for delivering power from the first input port to the first semiconductor die, and a fourth transmission path for delivering power from the first input port to the second semiconductor die.

3. The device according to claim 2 further comprising a first power splitter disposed at the joint of the third transmission path and the fourth transmission path.

4. The device according to claim 1 further comprising a first power combiner disposed at the joint of the first transmission path and the second transmission path.

5. The device according to claim 1 further comprising:
   a third conductor, in the wiring structure, configured to connect a second input port to the first semiconductor die and the second semiconductor die, the third conductor providing a fifth transmission path for delivering power from the second input port to the first semiconductor die, and a sixth transmission path for delivering power from the second input port to the second semiconductor die.

6. The device according to claim 1 further comprising:
   a fourth conductor, in the wiring structure, configured to connect the first semiconductor die and the second semiconductor die to a second output port at the second surface of the wiring structure, the fourth conductor providing a seventh transmission path for delivering power from the first semiconductor die to the second output port, and an eighth transmission path for delivering power from the fourth semiconductor die to the second output port.

7. The device according to claim 1 further comprising:
   a third semiconductor die on the first surface of the wiring structure, the third semiconductor die including a third power amplifier unit; and
   a fourth semiconductor die on the first surface of the wiring structure, the fourth semiconductor die including a fourth power amplifier unit and being spaced apart from the third semiconductor die.

8. The device according to claim 7, wherein the first conductor further provides a fifth transmission path for delivering power from the first input port to the third semiconductor die, and a sixth transmission path for delivering power from the first input port to the fourth semiconductor die.

9. The device according to claim 8 further includes a second power splitter disposed at the joint of the fifth transmission path and the sixth transmission path.

10. The device according to claim 1 further comprising a thermal conductive layer on the first semiconductor die and the second semiconductor die.

11. The device according to claim 10 further comprising a thermal conductive column between the thermal conductive layer and the wiring structure.

12. A device, comprising:
a wiring structure;
a first semiconductor die, on the wiring structure, including a first power amplifier unit;
a second semiconductor die, on the wiring structure, including a second power amplifier unit and being spaced apart from the first semiconductor die;
a thermal conductive layer on the first semiconductor die and the second semiconductor die,
wherein the wiring structure further comprises:
 a first output port disposed on a surface opposite the first semiconductor die and the second semiconductor die; and
 a first conductor connecting the first semiconductor die and the second semiconductor die to the first output port, wherein the first conductor provides a first transmission path for delivering power from the first semiconductor die to the first output port, and a second transmission path for delivering power from the second semiconductor die to the first output port.

13. The device according to claim 12, wherein the thermal conductive layer includes silicon-based material.

14. The device according to claim 12 further comprising a thermal conductive column between the thermal conductive layer and the wiring structure.

15. The device according to claim 12 further comprising a thermal interface layer between the thermal conductive layer and the first semiconductor die and the second semiconductor die.

16. A method, comprising:
providing a carrier;
attaching a first semiconductor die and a second semiconductor die on the carrier, the first semiconductor die including a first power amplifier unit, the second semiconductor die including a second power amplifier unit and being spaced apart from the first semiconductor die;
encapsulating the first semiconductor die and the second semiconductor die in an encapsulating layer; and
forming a wiring structure on the encapsulating layer, the wiring structure comprising:
 an input port and an output port, the input port and the output port being disposed on a surface opposite the first semiconductor die and the second semiconductor die;
 a first conductor configured to electrically connect the input port to the first semiconductor die and the second semiconductor die; and
 a second conductor configured to electrically connect the first semiconductor die and the second semiconductor die to the output port,
wherein the second conductor provides a first transmission path for delivering power from the first semiconductor die to the output port, and a second transmission path for delivering power from the second semiconductor die to the output port.

17. The method according to claim 16, wherein the carrier includes a thermally conductive material.

18. The method according to claim 16, before encapsulating the first semiconductor die and the second semiconductor die, further comprising:
forming a thermal conductive column on the carrier.

* * * * *